(12) United States Patent
Moon et al.

(10) Patent No.: US 6,296,975 B1
(45) Date of Patent: Oct. 2, 2001

(54) PHOTO MASK OF SEMICONDUCTOR DEVICE AND METHOD FOR MANUFACTURING THE SAME

(75) Inventors: Seong-yong Moon; Yong-hoon Kim, both of Kyungki-do; Kwang-soo No, Daejeon, all of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/426,762

(22) Filed: Oct. 26, 1999

(30) Foreign Application Priority Data

Oct. 28, 1998 (KR) .................................................. 98-45350
Jul. 14, 1999 (KR) .................................................. 99-28410

(51) Int. Cl.$^7$ ...................................................... G03F 9/00
(52) U.S. Cl. ............................................................ 430/5
(58) Field of Search ..................................................... 430/5

(56) References Cited

U.S. PATENT DOCUMENTS 5,733,688 * 3/1998 Kato et al. ................................ 430/5
5,814,423 * 9/1998 Maruyama et al. ...................... 430/5

OTHER PUBLICATIONS

Akira Chiba et al., "Antireflective MoSi photomasks," J. Vac. Sci. Technol. B 10(6), Nov./Dec. 1992, 1992 American Vacuum Society, pp. 2480–2485.

Rik Jonckheere et al., "Molybdenum silicide based attenuated phase–shift masks," J. Vac. Sci. Technol. B 12(6), Nov./Dec. 1994, 1994 American Vacuum Society, pp. 3765–3772.

Y. Watakabe et al., "High performance very large scale integrated photomaks with a silicide film," J. Vac. Sci. Technol. B. vol. 4. No. 4. Jul./Aug. 1986, pp. 842–844.

Seong–ju Park et al., "A mechanistic study of SF6/O2 reactive ion etching of molybdenum," J. Vac. Sci. Technol. B 5 (50, Sep./Oct. 1987, 1987 American Vacuum Society, pp. 1372–1373.

Akira Shigetomi et al., "Fabrication technologies for advanced 5X reticles for 16M–bit dynamic random access memory," J. Vac. Sci. Technol. B 8 (2) Mar./Apr. 1990, 1990 American Vacuum Society, pp. 117–121.

Charles H. Fields et al., "The Use of Amorphous Silicon for Deep UV Masks," SPIE vol. 1927 Optical/Laser Microlithography VI (1993), pp. 727–735.

C. Pierrat et al., "Dry etched molybdenum silicide photomasks for submicron integrated circuit fabrication," J. Vac. Sci. Technol. B 9 (6), Nov./Dec. 1991, 1991 Amercan Vacuum Society, pp. 3132–3137.

* cited by examiner

Primary Examiner—Christopher G. Young
(74) Attorney, Agent, or Firm—Jones Volentine, PLLC

(57) ABSTRACT

A photo mask of a semiconductor device includes a transmission preventing layer formed of a molybdenum alloy, which is a solid solution of a metal atom such as chrome in molybdenum, on a light transmitting substrate. Also, the molybdenum alloy may be a molybdenum vanadium alloy, a molybdenum niobium alloy, a molybdenum tantalum alloy, or a molybdenum tungsten alloy, which is a solid solution of vanadium, niobium, tantalum, or tungsten in molybdenum, respectively. The photo mask provides high resolution during a photolithography process by obtaining a thinner transmission preventing layer.

14 Claims, 4 Drawing Sheets

PHOTO MASK OF SEMICONDUCTOR DEVICE AND METHOD FOR MANUFACTURING THE SAME

BACKGROUND OF THE INVENTION

1. Field of the Invention

The present invention relates to a semiconductor device, and more particularly, to a photo mask and a method for manufacturing the same.

2. Background of the Related Art

A photolithography process for patterning a material film on a semiconductor substrate is one of a group of processes for manufacturing a semiconductor device. A photo mask is used in selectively exposing photoresist film in the photolithography process. The photo mask is formed by patterning an opaque layer on a transmitting substrate according to a desired pattern.

A conventional photo mask comprises a structure in which a chrome layer, which is a transmission preventing layer, is formed on a light transmitting substrate such as a quartz substrate. A chrome oxide layer for preventing reflection by the chrome layer may be further formed on the chrome layer.

As semiconductor devices become more highly integrated, their design rule is reduced. Hence, the wavelength of the light source used in an exposing process is also reduced. Thus, it is necessary to use KrF or ArF as a light source in order to realize a feature size of no more than about 150–250 nm. Accordingly, it is necessary to form finer photomask patterns. It is also important to secure a processing margin during the fabrication of the photo mask. To do this, a dry etching method for the process of manufacturing the photo mask must be used.

However, it is difficult to apply the dry etching method to patterning the chrome layer used for the conventional photo mask. This is because the chrome layer has a low etching selectivity with respect to the photoresist layer for the reaction gas used in the dry etching. Chemical amplitude resist (CAR) or E-beam resist (EBR) are mainly used for the photoresist layer. These resist materials have a low etching selectivity with respect to the chrome layer for the reaction gas. Therefore, a very thick photoresist film is required for patterning the chrome layer using the dry etching method. However, resolution is reduced by using the very thick photoresist film, which is not suitable for manufacturing a highly integrated semiconductor device.

In order to compensate for this, a wet etching method is used for patterning the chrome layer. The wet etching method can limit the minimization of the feature size due to a wall angle and an edge slope. Accordingly, it is very difficult to realize a uniform line width of no more than about 1 $\mu$m on the overall mask. As a result, it is difficult to realize a high resolution. Furthermore, when the chrome layer is patterned by the wet etching method, efficiency is relatively lower than when the chrome layer is patterned by the dry etching method.

The thickness of the transmission preventing layer must be reduced in order to realize high resolution. It is possible to reduce the thickness of the photoresist film for patterning the transmission preventing layer by reducing the thickness of the transmission preventing layer. Therefore, it is possible to form a finer-sized transmission preventing layer pattern, thereby increasing the resolution of the photo mask.

It is necessary to use a material layer having a higher optical density (OD) characteristic or a higher extinction coefficient k than the chrome layer in order to form the transmission preventing layer to a reduced thickness. A high extinction coefficient k or a high OD characteristic means that it is possible to selectively block the light used for the exposing process by a layer having a smaller thickness.

Another drawback of the chrome layer used for the conventional photo mask is that it has a relatively low adhesion to the quartz substrate, and thus a pattern defect may occur during the process of patterning the chrome layer. When the pattern defect occurs, a process of repairing the pattern defect by a focused ion beam (FIB) repair or a laser repair must be performed. During such repair, the substrate may be damaged, thus generating a river bed or reducing the transmissivity of the substrate.

Substituting a molybdenum silicide (Mo—Si) material layer for the chrome layer, for example a $MoSi_2$ layer, has been attempted. Y. Watakabe, et al., "High performance very large scale integrated photomask with a silicide film", J. Vac. Sci. Technol. B(4), pp. 841–844, 1986. See also, Akira Shigetomi et al., "Fabrication technologies for advanced 5x reticles for 16M-bit dynamic random access memory", J. Vac. Sci. Technol. B8(2), pp. 117–121. 1990. Patterning the Mo—Si layer by a dry etch method has also been attempted. C. Pierrat, et al., "Dry etched molybdenum silicide photomasks for submicron integrated circuit fabrication", J. Vac. Sci. Technol. B9(6), pp. 3132–3137, 1991. Forming an anti-reflective layer on the Mo—Si material layer has been attempted as well. Akira Chiba, "Antireflective MoSi photomasks", J. Vac. Sci. Technol. B10(16), pp. 2480–2485, 1992. Research into applying the Mo—Si material layer on the phase shift mask (PSM) has also been performed. Rik Jonckheere, "Molybdenum silicide based attenuated phase-shift masks", J. Vac. Sci. Technol. B12(6), pp. 3765–3772, 1994. Research into using an amorphous silicon layer has also been performed. Charles H. Fields, et al., "The Use of Amorphous Silicon for Deep UV Masks", SPIE Vol. 1927, pp. 727–735, 1993.

However, the Mo—Si material layer has a low electrical conductivity due to the fact that the Si atom has a low conductivity when contained in the Mo—Si material layer. Accordingly, an additional charge dissipation layer should be used when the photoresist film is exposed using an electron beam. Also, Mo easily dissolves in chemical solution such as $H_2O_2$, used in a cleaning process after performing patterning. Therefore, after performing patterning, film morphology may deteriorate or a pattern may be poor.

SUMMARY OF THE INVENTION

It is an object of the present invention to provide a photo mask of a semiconductor device which can provide high resolution during a photolithography process by obtaining a thinner transmission preventing layer.

Accordingly, to achieve the above object, there is provided a photo mask of a semiconductor device comprising a light transmitting substrate and a transmission preventing layer formed of a molybdenum alloy on the substrate, wherein the molybdenum alloy is a solid solution of a metal atom and molybdenum.

The molybdenum alloy may be a molybdenum chrome alloy which is a substitutional solid solution of chrome in molybdenum. The chrome is in complete solid solution by substituting molybdenum for the entire composition range.

The molybdenum alloy may be a solid solution of molybdenum and one element selected from the group consisting of tungsten, vanadium, niobium, and tantalum. In other words, the molybdenum alloy may be a molybdenum tungsten alloy which is a substitutional solid solution of tungsten and molybdenum, a molybdenum vanadium alloy which is a substitutional solid solution of vanadium and molybdenum, a molybdenum niobium alloy which is a substitutional solid solution of niobium and molybdenum, or a molybdenum tantalum alloy which is a substitutional solid solution of tantalum and molybdenum.

To further achieve the above object, a method for manufacturing a photo mask of a semiconductor device uses a light transmitting substrate. A transmission preventing layer is formed of a molybdenum alloy layer on the substrate, wherein the molybdenum alloy is a solid solution of a metal atom and molybdenum.

The molybdenum alloy layer is formed by sputtering a target of a molybdenum chrome alloy, which is a substitutional solid solution of chrome and molybdenum, or by sputtering a target of an alloy that is a solid solution of molybdenum and one element selected from the group consisting of tungsten, vanadium, niobium, and tantalum.

According to the present invention, it is possible to provide high resolution during a photolithography process by realizing a thinner transmission preventing layer.

BRIEF DESCRIPTION OF THE ATTACHED DRAWINGS

The above object and advantages of the present invention will become more apparent by describing in detail a preferred embodiment thereof with reference to the attached drawings in which.

DETAILED DESCRIPTION OF PREFERRED EMBODIMENTS

Figure 1:
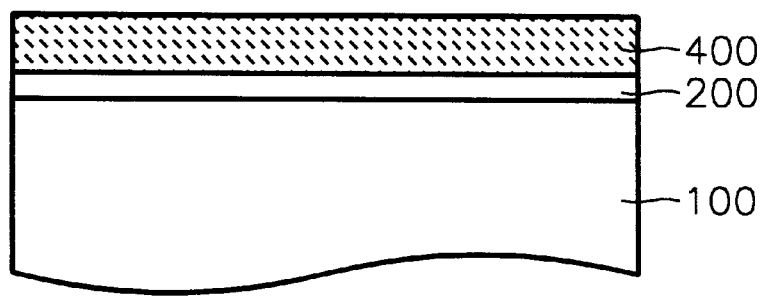
FIG. 1 is a cross sectional view schematically showing a photo mask according to an embodiment of the present invention.

Hereinafter, embodiments of the present invention will be described in detail with reference to the attached drawings. The present invention is not restricted to the following embodiments, and many variations are possible within the scope and spirit of the present invention. The embodiments of the present invention are provided in order to more completely explain the present invention to anyone skilled in the art. In the drawings, the thicknesses of films are exaggerated for clarity and the same reference numerals denote the same members. Also, when a film is described as being on another film or a semiconductor substrate, it can be directly on the other film or the semiconductor substrate or an interlayer film can exist therebetween.

FIG. 1 is a cross sectional view schematically showing a photo mask according to an embodiment of the present invention. The photo mask includes a transmission preventing layer 200 formed on a light transmitting substrate 100.

The transmission preventing layer 200 is formed of a Mo alloy which is a solid solution of molybdenum and metal atoms. The metal atoms can completely dissolve in molybdenum by substituting molybdenum for the entire composition range, thus forming a complete solid solution.

Metal atoms which can offset and improve the characteristics of molybdenum may be used as the material in solid solution. As such a material dissolves in molybdenum for solid solution, the chemical and mechanical characteristics can be changed. A dissolving material which substantially substitutes molybdenum for substitutional solid solution is preferable. Also, a material which substantially dissolves in molybdenum for the entire composition range for complete solid solution is preferable.

Chrome can be used as the dissolving material for solid solution. That is, the transmission preventing layer 200 can be formed of a molybdenum chrome alloy which is a solid solution of chrome in molybdenum. The molybdenum chrome alloy is in the form of a solid solution as shown in FIG. 2.

Vanadium (V), tungsten (W), niobium (Nb), or tantalum (Ta) may also be used as dissolving materials which improve the characteristics of molybdenum by being in solid solution with molybdenum.

Figure 2:
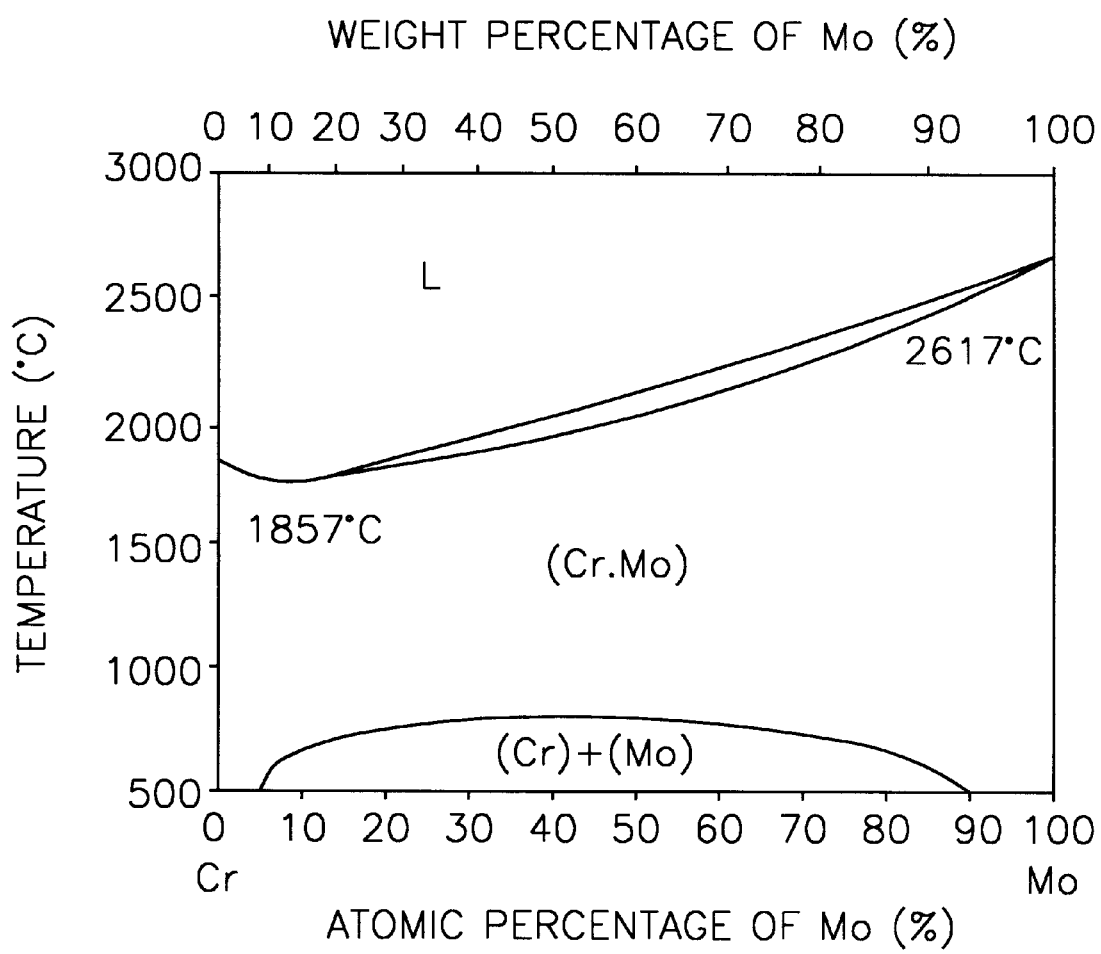
FIG. 2 is a binary phase diagram of molybdenum and chrome.

FIG. 2 shows a binary phase diagram of molybdenum and chrome. Although the characteristics of the Mo alloy are described through the solid solution of chrome and molybdenum, that is, the molybdenum chrome alloy, a solid solution formed by the substitutional solid solution of vanadium, tungsten, niobium, or tantalum, with molybdenum can be used as well for the transmission preventing layer 200.

Referring to the binary phase diagram of FIG. 2, it is noted that the solid solution of chrome in molybdenum can be performed for the entire composition range. Also, it is noted that chrome is in solid solution by substituting molybdenum. This can be supported by the fact that the lattice constant of chrome which is about 2.882 Å is similar to the lattice constant of molybdenum which is 3.147 Å. Since the substitutional solid solution of chrome in molybdenum can be performed for the entire composition range, the molybdenum chrome alloy is formed in complete substitutional solid solution.

In general, the substitutional solid solution shows both characteristics of the two components which form the solid solution. Therefore, from a metallurgical point of view, the material layer formed of the molybdenum chrome alloy has both characteristics of a chrome layer and a molybdenum layer. Accordingly, in order to describe the characteristics of the transmission preventing layer 200 formed of the molybdenum chrome alloy, the characteristics of a transmission preventing layer formed of a chrome layer and the characteristics of the transmission preventing layer formed of a molybdenum layer will be described below.

The chrome layer has a low selectivity with the photoresist film when a dry etching method is applied. The chrome layer has an extinction coefficient k that is lower than that of molybdenum as shown in Table 1 below and FIG. 3 with respect to a light source having a wavelength of about 193 nm.

Figure 3:
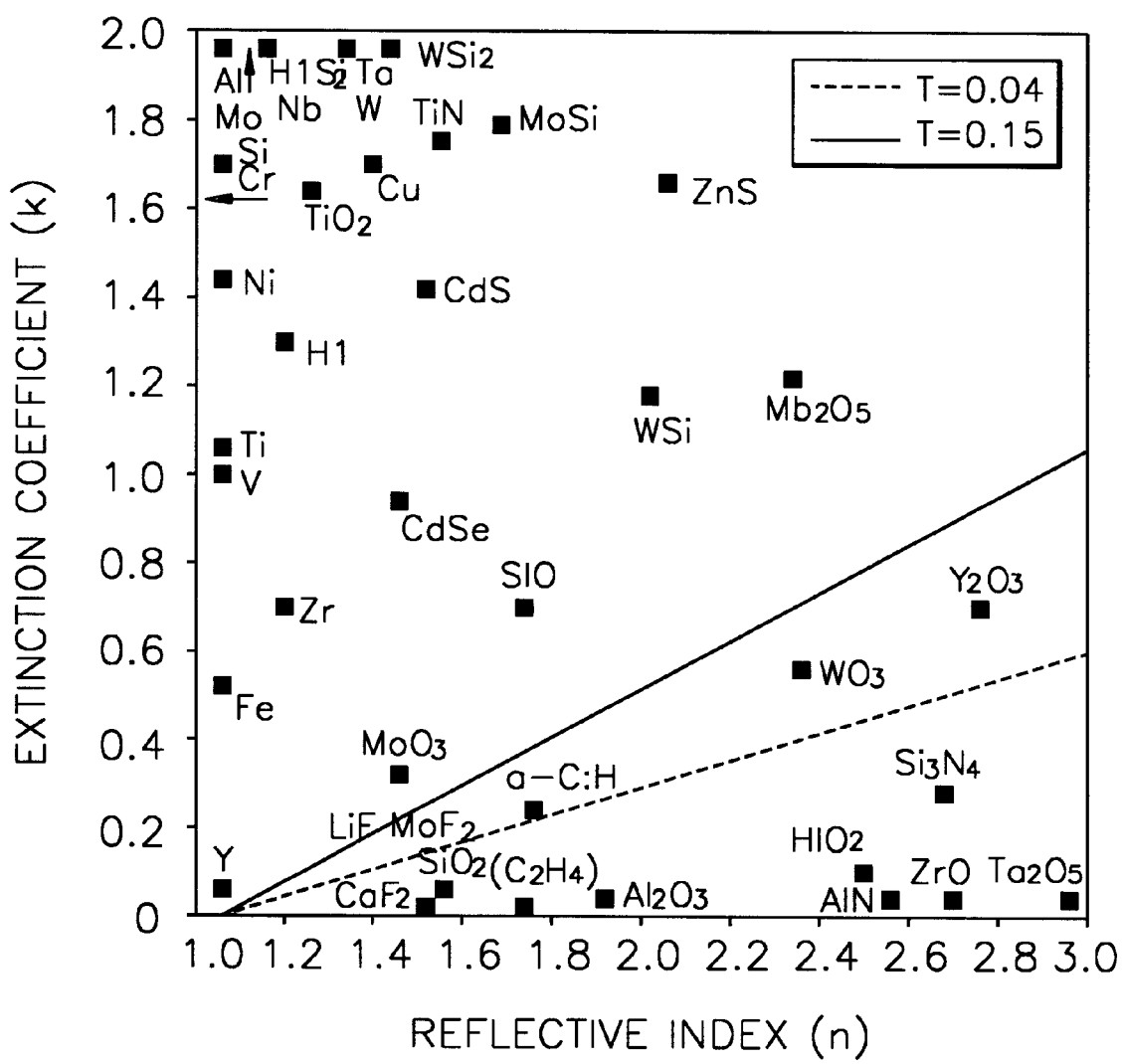
FIG. 3 is a graph showing extinction coefficient k values of various materials for the wavelength of 193nm.
Figure 4:
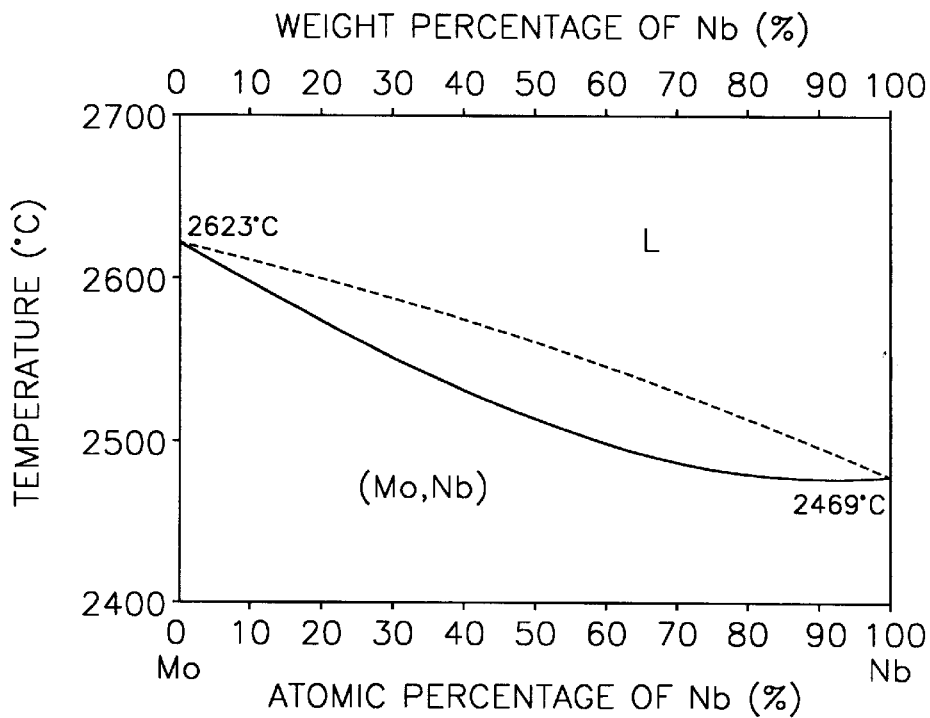
FIG. 4 is a binary phase diagram of molybdenum and niobium.
Figure 5:
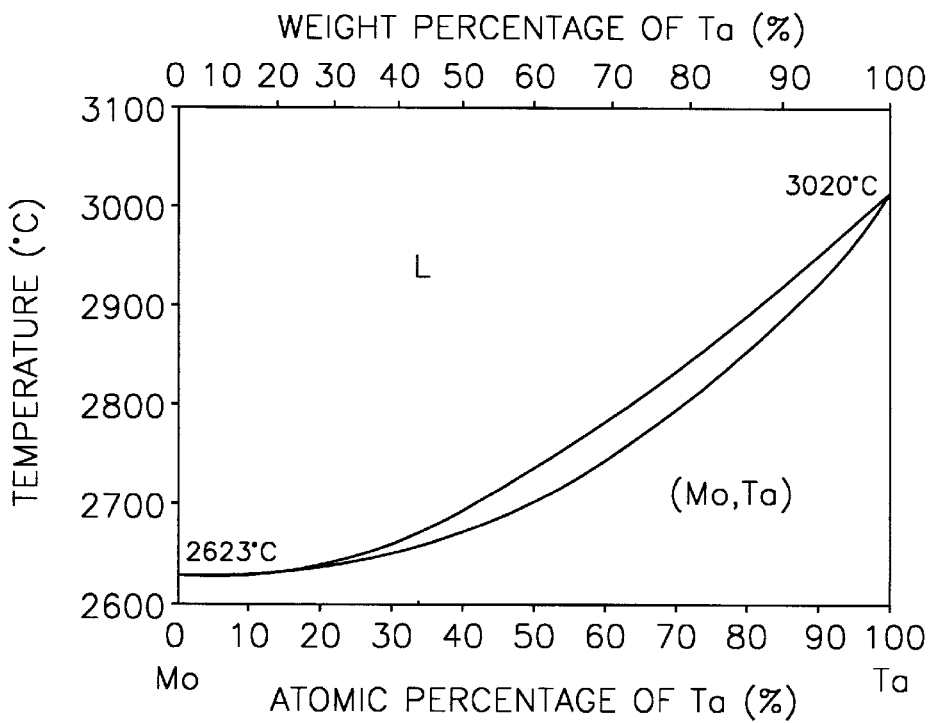
FIG. 5 is a binary phase diagram of molybdenum and tantalum.
Figure 6:
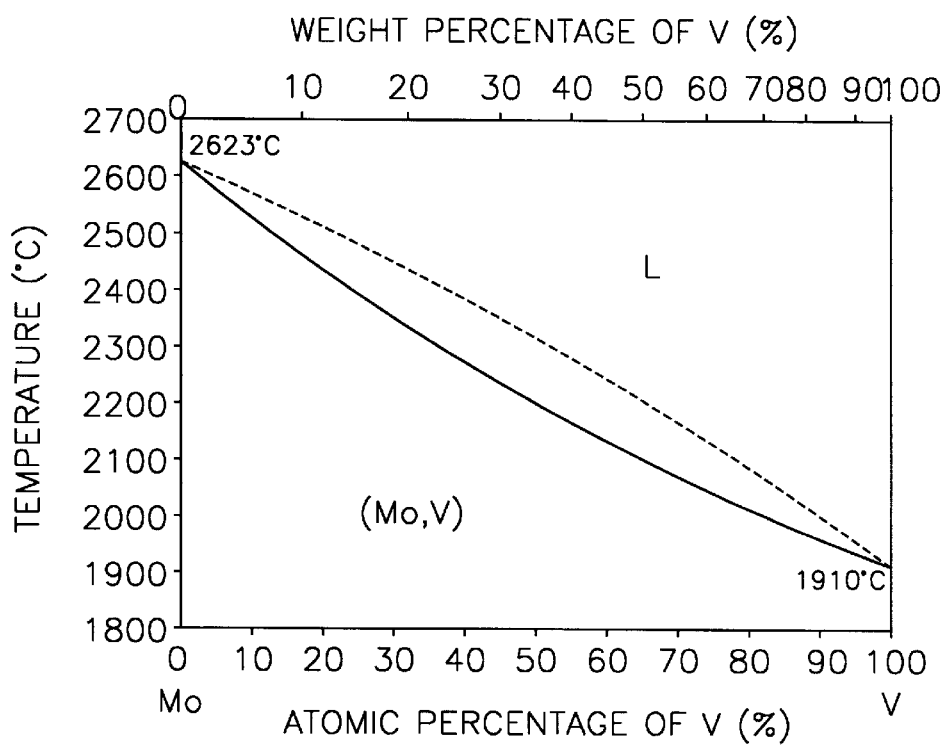
FIG. 6 is a binary phase diagram of molybdenum and vanadium.
Figure 7:
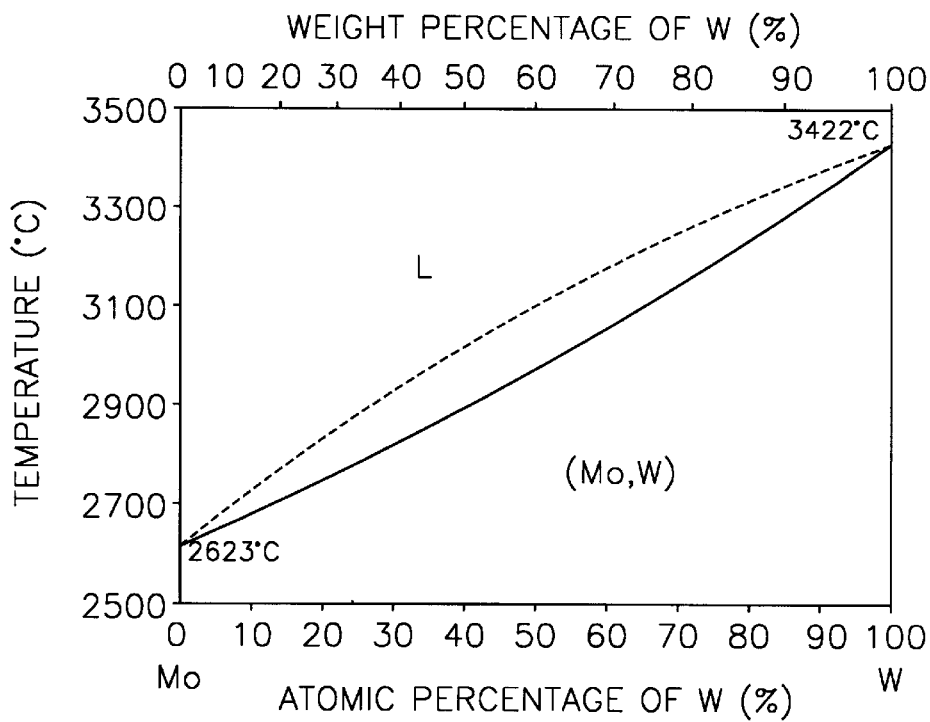
FIG. 7 is a binary phase diagram of molybdenum and tungsten.

Table 1 shows the optical characteristic with respect to a material used as the transmission preventing layer of the photo mask. In particular, it is noted from Table 1 that chrome has a lower extinction coefficient k than Mo, Ta, or W with respect to a light source having a wavelength of 248 nm and 193 nm. FIG. 3 shows the extinction coefficients k and reflective indices n of various materials at the wavelength of 193 nm. In FIG. 3, T denotes transmittance. Materials showing an extinction coefficient k larger than the extinction coefficient marked with an arrow are suitable for the transmission preventing layer. In Table 1 and FIG. 3, since the chrome layer has an extinction coefficient k lower than that of the molybdenum layer, the chrome layer should be formed so as to have a larger thickness than the molybdenum layer in order to prevent the transmission of light.

In general, the molybdenum layer has the following characteristics. Molybdenum has an extinction coefficient k higher than that of chrome as shown in Table 1 and FIG. 3. Also, molybdenum has a high OD value. Therefore, it is apparent that it is possible to obtain an effective result when a molybdenum layer thinner than the chrome layer is used. Furthermore, since the molybdenum layer can be formed to be thinner, the thermal capacity transmitted to the substrate becomes smaller when the defect is repaired by the laser

TABLE 1

Electrical and optical characteristics of various materials used for a photo mask

|    | Resistance ($\mu\Omega$ cm) | Lattice constant (Å) | Optical characteristic | | | | | | | |
|----|---|---|---|---|---|---|---|---|---|---|
|    |   |   | 436 nm | | 365 nm | | 248 nm | | 193 nm | |
|    |   |   | n | k | n | k | n | k | n | k |
| Al | 2.67   | 4.048 | 0.58 | 5.3  | 0.41 | 4.43 | 0.19 | 2.94 | 0.11 | 2.17 |
| Cr | 13.2   | 2.882 | 1.80 | 4.06 | 1.39 | 3.24 | 0.85 | 2.01 | 0.85 | 1.66 |
| Mo | 5.7    | 3.147 | 3.05 | 3.33 | 3.06 | 3.19 | 1.46 | 3.62 | 0.79 | 2.36 |
| Ta | 13.5   | 3.303 | 2.84 | 2.20 | 2.61 | 2.33 | 2.58 | 2.20 | 1.37 | 2.33 |
| Ti | 54     | 2.951 |      |      |      |      |      |      |      |      |
| W  | 5.4    | 3.165 | 3.31 | 3.39 | 3.39 | 2.66 | 3.4  | 2.85 | 1.31 | 3.04 |
| Ge | 89,000 | 5.657 | 4.03 | 4.03 | 4.07 | 2.58 | 1.39 | 3.20 | 1.10 | 2.05 |

Since the chrome layer has relatively low adhesion to the quartz substrate, a pattern defect may be generated in the process of patterning the chrome layer. When a pattern defect is generated, a process of repairing the pattern defect is performed by a focused ion beam (FIB) repair or a laser repair.

The FIB repair is a technology that removes an opaque defect, i.e., the undesired part of the chrome layer, using a physical force. Here, some part of the chrome layer is milled by the physical force obtained by the accelerated ion beam. In other words, a small portion of the chrome layer is sequentially milled by a minute thickness, thus removing part of the chrome layer. In this case, since the adhesion between the chrome atoms in the chrome layer is larger than that between the molybdenum atoms in the molybdenum layer, the ion beam should be accelerated at a higher speed to perform the milling process, which may damage the substrate.

A defect on the substrate such as a river bed may be generated by the FIB repair. Namely, since the edge of the defect is removed at a higher speed than the center of the defect, a defect similar to the bottom of a river may be generated on the substrate. The river bed is generated more often when the chrome layer is thicker. Therefore, the river bed is generated more severely in the chrome layer which should be formed to be thicker than the molybdenum layer.

A defect on the substrate, such as a reduction of the transmittance of the substrate, may also be generated when the laser repair is performed. More heat can be transmitted to a substrate during the laser repair. Accordingly, some of quartz of the substrate is separated due to evaporation, or is melted to be re-solidified. The re-solidification can change the transmittance of the substrate since it causes a change in the microstructure of the substrate.

However, chrome has an excellent resistance to chemical solution, i.e., an excellent chemical tolerance. Accordingly, it is easily patterned by a wet etching process. Meanwhile, it shows a low etching rate with respect to dry etching, thus showing a low etching selectivity with the photoresist pattern. Accordingly, it is difficult to apply the dry etching method to the patterning of chrome.

repair after patterning the molybdenum layer. Therefore, the generation of defects on the substrate may be reduced.

Also, since the molybdenum layer can be used in a thinner state and has less adhesion than the chrome layer, defects thereof can be removed faster using the same amount of applied power when the FIB repair is performed. Also, it is possible to prevent Ga ions from being projected into the substrate since it is possible to lower the acceleration of the ion beam. Namely, since the depth of the Ga ions projected into the substrate becomes smaller, it is possible to prevent the generation of the river bed.

Molybdenum has a higher electrical conductivity than chrome. The high electrical conductivity is advantageous in preventing the generation of defects such as a pattern defect caused by static electricity. For example, when a lower film has a low electrical conductivity, and the photoresist film is exposed by the electron beam, the pattern is damaged by the static electricity caused by the electron beam. Therefore, an additional charge dissipation layer is required when a material layer having a low conductivity such as the chrome layer is used as the transmission preventing layer. The additional charge dissipation layer is not required in a material layer having a high conductivity such as the molybdenum layer.

Molybdenum exhibits a higher etching speed than that of chrome with respect to the reaction gas used for a general dry etching method. Accordingly, it is possible to realize selective etching by consuming less of the photoresist film. However, molybdenum is easily dissolved in a chemical solution having a low reactivity such as oxygenated water. Namely, the resistance to the chemical solution is lower than the chrome layer. Accordingly, the line width of the pattern can be damaged by performing cleaning after performing the patterning.

In the embodiment of the present invention, it is possible to realize the advantages of both the chrome layer and the molybdenum layer using the substitutional solid solution of chrome and molybdenum as the transmission preventing layer. It is also possible to offset and supplement the defects of the chrome layer and the molybdenum layer.

This can be understood on the basis in that in metallurgy, the complete substitutional solid solution exhibits characteristics of the two materials. Namely, the solid solution formed for the entire composition range generally shows the mechanical and chemical characteristics of the respective components. Such characteristics are shown in proportion to the contents of the respective components.

The molybdenum chrome alloy layer according to the present invention shows the following characteristics.

The low resistance of molybdenum to chemical solution can be compensated for or increased by chrome. For example, a pure molybdenum layer is eroded at high speed by the oxygenated water in the cleaning solution obtained by adding sulfuric acid to the oxygenated water, which is generally used for cleaning a semiconductor device, in particular, a mask, or to a mixture of the oxygenated water and pure water. However, the molybdenum chrome alloy layer according to a first embodiment of the present invention, for example, the alloy layer obtained by the solid solution of 30% of chrome in 70% of molybdenum does not react to the above mixture, in particular, the oxygenated water. It is noted from the above that the molybdenum chrome layer has an excellent chemical tolerance since the low chemical resistance of molybdenum is offset by the higher chemical tolerance of the chrome layer.

Since the molybdenum chrome alloy layer is thinner than the chrome layer, it can be used as the transmission preventing layer (200 of FIG. 1). For example, the molybdenum chrome alloy layer can be used as the transmission preventing layer 200 when it is formed to have a thickness of about 500 Å to 700 Å. This is due to the excellent extinction coefficient k value of molybdenum, as shown in Table 1. Molybdenum has a k value of about 2.36 at a wavelength of 193 nm. Meanwhile, chrome shows a low k value of 1.66. Therefore, the molybdenum chrome alloy layer can have a higher k value than that of the chrome layer since the low k value of chrome is offset by the high k value of molybdenum. Accordingly, it is possible to obtain a more desirable transmission preventing effect by a thinner molybdenum chrome alloy layer than by a thick chrome layer. This means that the thinner molybdenum chrome alloy layer can secure more OD.

Since a thinner molybdenum chrome alloy layer can be used as the transmission preventing layer 200 a high resolution can be realized. Also, it is possible to prevent the generation of defects on the substrate in FIB repair or laser repair.

Molybdenum shows a higher dry etching rate than chrome in a dry etching method using a typical reaction gas. Accordingly, since it is possible to offset the low dry etching rate of chrome, the molybdenum chrome alloy layer has a higher dry etching rate than the chrome layer. This means that the dry etching method can be used for patterning the transmission preventing layer 200 when the molybdenum chrome alloy is used as the transmission preventing layer 200.

Furthermore, since it is possible to form a thinner molybdenum chrome alloy layer and to realize a higher dry etching rate, it is possible to secure more etching selectivity with the photoresist film. Namely, it is possible to secure a broader selection of the photoresist film used for selective etching. Also, since the molybdenum chrome alloy layer becomes thinner, it is possible to prevent a side cut in the wet etching process. Furthermore, since molybdenum has a lower resistance to chemical solution than the chrome layer, it is possible to increase the wet etching rate of the molybdenum chrome alloy layer. Accordingly, it is possible to secure a processing margin for a developing process.

Since molybdenum can offset the poor adhesion characteristic of chrome to the substrate, the molybdenum chrome alloy layer has a high degree of adhesion to the substrate. Accordingly, it is possible to prevent defects generated in patterning the transmission preventing layer 200.

Also, molybdenum has a higher electrical conductivity than chrome. Therefore, the molybdenum chrome alloy layer can have a higher electrical conductivity than the chrome layer. Therefore, it is possible to prevent the generation of a defect caused by static electricity according to the accumulation of charges in the exposing process using an electron beam.

The molybdenum chrome alloy layer can be formed, for example, by a method of sputtering using a target formed of about 90% of molybdenum and about 10% of chrome. Here, about 30 sccm of argon is provided and a chamber pressure of about 40 mTorr is maintained. The molybdenum chrome alloy layer is formed on a substrate by applying RF power of about 150 W to argon, thus sputtering the target.

The composition of the target, the chamber pressure condition, and the applied power condition can be changed according to the composition of the molybdenum chrome alloy layer formed by the sputtering method. Also, the above mentioned sputtering method can be used to obtain solid solutions of vanadium, tungsten, niobium, or tantalum in molybdenum by exchanging the target.

It is possible to also improve the characteristics of molybdenum as mentioned above by the substitutional solid solution of tantalum, vanadium, niobium, or tungsten in molybdenum. This is because the characteristics of the solid solution can be improved by the above mentioned complete substitutional solid solution as shown in FIGS. 4 through 7. Niobium, tantalum, vanadium, and tungsten are in substitutional solid solution in molybdenum for the entire composition range, thus improving the characteristics of the molybdenum layer, similar to that of the molybdenum chrome alloy.

FIGS. 4 through 7 respectively show the binary phase diagrams of molybdenum and niobium, molybdenum and tantalum, molybdenum and vanadium, and molybdenum and tungsten. As stated above, molybdenum, niobium, tantalum, vanadium, and tungsten are in substitutional solid solution in molybdenum for the entire composition range. Therefore, a molybdenum niobium alloy, a molybdenum tantalum alloy, a molybdenum vanadium alloy, and a molybdenum tungsten alloy are complete substitutional solid solutions of the above mentioned atoms in molybdenum.

Since niobium, tantalum, vanadium, and tungsten can be in complete substitutional solid solution in molybdenum, the above atoms can improve the characteristics of the molybdenum layer as mentioned above with respect to the molybdenum chrome alloy. For example, the low resistance of molybdenum to a chemical solution such as oxygenated water can be improved by niobium, tantalum, vanadium, and tungsten which are in solid solution in molybdenum. Namely, it is possible to increase chemical tolerance.

Also, since tantalum, vanadium, niobium, and tungsten have a relatively high extinction coefficient k and a relatively low reflection index n as shown in FIG. 3, the solid solutions of the above atoms in molybdenum have excellent extinction characteristics. Therefore, it is possible to form the transmission preventing layer 200 of FIG. 1 to a smaller thickness.

This means that, when the solid solution of tantalum, vanadium, niobium, or tungsten in molybdenum is used as the transmission preventing layer 200, a developing margin can be increased with respect to the transmission preventing layer 200 in the wet or dry etching process. Namely, it is possible to reduce the thickness of the photoresist layer by reducing the thickness of the transmission preventing layer 200 as described with respect to the molybdenum chrome alloy layer. This means that the resolution can be increased. Also, the influence of the selectivity with respect to the photoresist is reduced in the dry etching process. Therefore, it is possible to introduce various kinds of photoresist.

Meanwhile, the molybdenum tantalum alloy layer, the molybdenum vanadium alloy layer, the molybdenum niobium alloy layer, and the molybdenum tungsten alloy layer can be formed by sputtering targets respectively formed of the molybdenum tantalum alloy, the molybdenum niobium alloy, the molybdenum vanadium alloy, and the molybdenum tungsten alloy which are solid solutions of tantalum, niobium, vanadium, and tungsten in molybdenum, like the molybdenum chrome alloy layer. Thus, the composition of the formed molybdenum alloy layer, that is, the transmission preventing layer 200 is dependent on the composition of the target.

According to the present invention, the molybdenum alloy layer which is the complete substitutional solid solution can improve the characteristics of the molybdenum layer and the chrome layer. For example, it is possible to improve the extinction coefficient and the chemical tolerance. Also, the molybdenum alloy layer can be used as the transmission preventing layer to reduce the thickness thereof Accordingly, it is possible to realize an appropriate resolution with respect to the light source having a short wavelength such as ArF and KrF.

Although, the invention has been described with reference to a particular embodiment, it will be apparent to one of ordinary skill in the art that modifications of the described embodiment may be made without departing from the spirit and scope of the invention.

What is claimed is:

1. A photo mask of a semiconductor device, comprising:
    a light transmitting substrate which is transparent to light produced by at least one of an ArF light source and a KrF light source; and
    a transmission preventing layer, formed of a molybdenum alloy, on the light transmitting substrate, wherein the molybdenum alloy comprises a solid solution of a metal atom and molybdenum, and wherein the transmission preventing layer blocks transmission of the light produced by at least one of the ArF light source and the KrF light source.

2. The photo mask of claim 1, wherein the molybdenum alloy is a molybdenum chrome alloy comprising a substitutional solid solution of chrome in molybdenum.

3. The photo mask of claim 2, wherein the chrome is in complete solid solution by substituting molybdenum for an entire composition range.

4. The photo mask of claim 1, wherein the molybdenum alloy is a solid solution of molybdenum and one element selected from the group consisting of tungsten, vanadium, niobium, and tantalum.

5. The photo mask of claim 1, wherein the molybdenum alloy is a molybdenum tungsten alloy comprising a substitutional solid solution of tungsten and molybdenum.

6. The photo mask of claim 1, wherein the molybdenum alloy is a molybdenum vanadium alloy comprising a substitutional solid solution of vanadium and molybdenum.

7. The photo mask of claim 1, wherein the molybdenum alloy is a molybdenum niobium alloy comprising a substitutional solid solution of niobium and molybdenum.

8. The photo mask of claim 1, wherein the molybdenum alloy is a molybdenum tantalum alloy comprising a substitutional solid solution of tantalum and molybdenum.

9. A method for manufacturing a photo mask of a semiconductor device, comprising:
    providing a light transmitting substrate which is transparent to light produced by at least one of an ArF light source and a KrF light source; and
    forming a transmission preventing layer of a molybdenum alloy layer on the light transmitting substrate, wherein the molybdenum alloy layer comprises a solid solution of a metal atom and molybdenum, and wherein the transmission preventing layer blocks transmission of the light produced by at least one of the ArF light source and the KrF light source.

10. The method of claim 9, wherein the molybdenum alloy layer is formed by sputtering a target of a molybdenum chrome alloy which is a substitutional solid solution of chrome and molybdenum.

11. The method of claim 9, wherein the molybdenum alloy layer is formed by sputtering a target of an alloy which is a solid solution of molybdenum and one element selected from the group consisting of tungsten, vanadium, niobium, and tantalum.

12. A photo mask of a semiconductor device, comprising:
    a light transmitting substrate; and
    a transmission preventing layer, formed of a molybdenum alloy, on the light transmitting substrate, wherein the molybdenum alloy is a molybdenum chrome alloy comprising a substitutional solid solution of chrome in molybdenum.

13. The photo mask of claim 12, wherein the chrome is in complete solid solution by substituting molybdenum for an entire composition range.

14. A method for manufacturing a photo mask of a semiconductor device, comprising:
    providing a light transmitting substrate; and
    forming a transmission preventing layer of a molybdenum alloy layer on the light transmitting substrate, wherein the molybdenum alloy layer is formed by sputtering a target of a molybdenum chrome alloy which is a substitutional solid solution of chrome and molybdenum.

* * * * *